(12) United States Patent
Zhu et al.

(10) Patent No.: US 8,742,545 B2
(45) Date of Patent: *Jun. 3, 2014

(54) SUBSTRATE STRIP PLATE STRUCTURE FOR SEMICONDUCTOR DEVICE AND METHOD OF MANUFACTURING THE SAME

(75) Inventors: Huilong Zhu, Poughkeepsie, NY (US); Haizhou Yin, Poughkeepsie, NY (US); Zhijiong Luo, Poughkeepsie, NY (US)

(73) Assignee: Sunovel Suzhou Technologies Ltd., Suzhou (CN)

( * ) Notice: Subject to any disclaimer, the term of this patent is extended or adjusted under 35 U.S.C. 154(b) by 28 days.

This patent is subject to a terminal disclaimer.

(21) Appl. No.: 13/264,063

(22) PCT Filed: Apr. 14, 2010

(86) PCT No.: PCT/CN2010/071770
§ 371 (c)(1),
(2), (4) Date: Oct. 12, 2011

(87) PCT Pub. No.: WO2010/118687
PCT Pub. Date: Oct. 21, 2010

(65) Prior Publication Data
US 2012/0181664 A1     Jul. 19, 2012

Related U.S. Application Data

(60) Provisional application No. 61/212,673, filed on Apr. 15, 2009.

(30) Foreign Application Priority Data

Mar. 5, 2010  (CN) .......................... 2010 1 0120365

(51) Int. Cl.
*H01L 29/06*   (2006.01)
*H01L 21/308*  (2006.01)

(52) U.S. Cl.
USPC ........................... 257/616; 257/622; 438/689

(58) Field of Classification Search
USPC ........................................................ 257/616
See application file for complete search history.

(56) References Cited

U.S. PATENT DOCUMENTS

| 6,191,007 B1 * | 2/2001 | Matsui et al. | 438/459 |
| 6,388,283 B1 * | 5/2002 | Owen | 257/301 |
| 6,566,149 B1 * | 5/2003 | Kanamaru et al. | 438/14 |
| 2004/0097012 A1 * | 5/2004 | Weber et al. | 438/113 |

* cited by examiner

*Primary Examiner* — Telly Green
*Assistant Examiner* — Damon Hillman
(74) *Attorney, Agent, or Firm* — Troutman Sanders LLP

(57) ABSTRACT

A strip plate structure and a method of manufacturing the same are disclosed. In one embodiment, the strip plate structure comprises a strip plate array comprising a plurality of strip plates arranged in a predetermined direction with spacing. Each of the strip plates includes a first surface facing one side direction of the strip plate structure and a second surface facing an substantially opposite side direction of the strip plate structure; and a plurality of strip sheets. Each strip sheet alternately abuts either the first surfaces or the second surfaces of two adjacent strip plates.

31 Claims, 7 Drawing Sheets

SUBSTRATE STRIP PLATE STRUCTURE FOR SEMICONDUCTOR DEVICE AND METHOD OF MANUFACTURING THE SAME

CROSS-REFERENCE OF RELATED APPLICATIONS

This application is a National Phase application of, and claims priority to, PCT Application No. PCT/CN2010/071770, filed on Apr. 14, 2010, entitled "SUBSTRATE STRUCTURE FOR SEMICONDUCTOR DEVICE FABRICATION AND METHOD FOR FABRICATING THE SAME", which claimed priority to U.S. patent application 61/212,673 filed on Apr. 15, 2009 and Chinese patent application No. 201010120365.X, filed on Mar. 5, 2010. The present application is also related to U.S. Patent Application titled "THIN-FILM SOLAR CELL STRUCTURE, THIN-FILM SOLAR CELL ARRAY AND METHOD FOR MANUFACTURING THE SAME", filed on Oct. 12, 2011, which is a National Phase application of, and claims priority to, PCT Application No. PCT/CN2010/071772. All of the patent applications above are incorporated herein by reference in their entireties.

FIELD OF THE INVENTION

The present invention relates to the field of semiconductor manufacturing. In particular, it relates to a strip plate structure having an enlarged surface area for semiconductor devices and a method of manufacturing the same.

BACKGROUND OF THE INVENTION

In recent years, with the rapid development of the semiconductor industry, the development of semiconductor devices is oriented towards a smaller volume, higher circuit intensity, a higher speed and lower power consumption, and integrated circuit has entered a technical phase of submicron level. Therefore, in order to meet the demands of a smaller volume and higher intensity, requirements have been proposed in two aspects so far: on the one hand, it is required that the diameter of wafers should be gradually increased, and by 2005, silicon wafers having a diameter of 300 mm have become mainstream and it is predicted that in 2012, silicon wafers having a diameter of 450 mm (18 in) will be in use, and the diameter of wafers is increasing continuously at a rate of about 1.5 times every 9 years while evolving towards larger area. On the other hand, a need has arisen that the utilization rate of the surface area could be increased without increasing the dimensions of existing wafers so as to increase the surface area thereof that can be processed. However, no solutions capable of increasing the utilization rate of wafers have been proposed so far based on the dimensions of existing wafers.

SUMMARY OF THE INVENTION

In order to solve the aforesaid problem, one objective of the present invention provides a strip plate structure formed from a substrate, comprising: a strip plate array including a plurality of strip plates with spacing, each of said strip plates including a first surface facing one direction of the strip plate structure and a second surface facing an substantially opposite direction of the strip plate structure, and a plurality of strip sheets, each strip sheet alternately abutting either the first surfaces or the second surfaces of two adjacent strip plates.

Moreover, the present invention further provides a method of manufacturing a strip plate structure for semiconductor devices, comprising: providing a substrate, said substrate having a first surface facing a first side of said substrate and a second surface facing a second side opposite to the first side of said substrate; forming at least two first trenches through the first surface of said substrate; and forming at least one second trench through the second surface of said substrate, wherein each of said at least second trench is located between two adjacent first trenches such that sidewalls of these neighboring trenches form at least two strip plates and at least one strip sheet, said strip plates are defined by sidewalls of neighboring ones of said first trenches and said second trench, and said strip sheet alternately abuts two neighboring strip plates.

According to another aspect of the present invention, after the steps above, the following step may be performed: stretching said strip plate structure along said predetermined direction such that the strip sheet between neighboring strip plates bends and said strip plate array substantially forms a plane.

Furthermore, according to another aspect of the present invention, there may be provided a strip plate structure formed from a substrate, comprising: a strip plate array, comprising a plurality of strip plates arranged in a predetermined direction with spacing, each of said plurality of strip plates including a first surface and a second surface opposite to the first surface, wherein said first surface of each of the strip plates is opposite to said first surface of a neighboring strip plate on one side thereof, and said second surface of each strip plate is opposite to said second surface of a neighboring strip plate on the other side thereof; and at least one bendable strip sheet, formed on two opposite surfaces of neighboring strip plates and bendably connecting said two neighboring strip plates. In a specific embodiment, there are at least two strip sheets, wherein the bending directions of neighboring bendable strip sheets are opposite to each other. At least two of said strip plates in said strip plate array are arranged on a plane perpendicular to said first surface.

The strip plate structure according to the present invention makes effective use of the thickness of the substrate so as to increase the surface area that can be processed or the utilization rate of the surface area of said substrate on the premise that the dimensions of said substrate is not increased. Furthermore, since said strip plate structure has a Great Wall shape, different material deposition and processing can be easily separately performed on the two sides of the strip plate structure in subsequent processes, with the use of the first trenches and the second trenches. In this way, it can meet various processing requirements, improve throughput and reduce cost.

Additional aspects and advantages of the invention will be set forth in part in the description which follows and, in part, will be obvious from the description, or may be learned by practice of the invention.

BRIEF DESCRIPTION OF THE DRAWINGS

The above and/or additional aspects and advantages of the present invention will become apparent and better understood through the description of the embodiments below in conjunction with the drawings, in which.

DETAILED DESCRIPTION OF THE INVENTION

Figure 1:
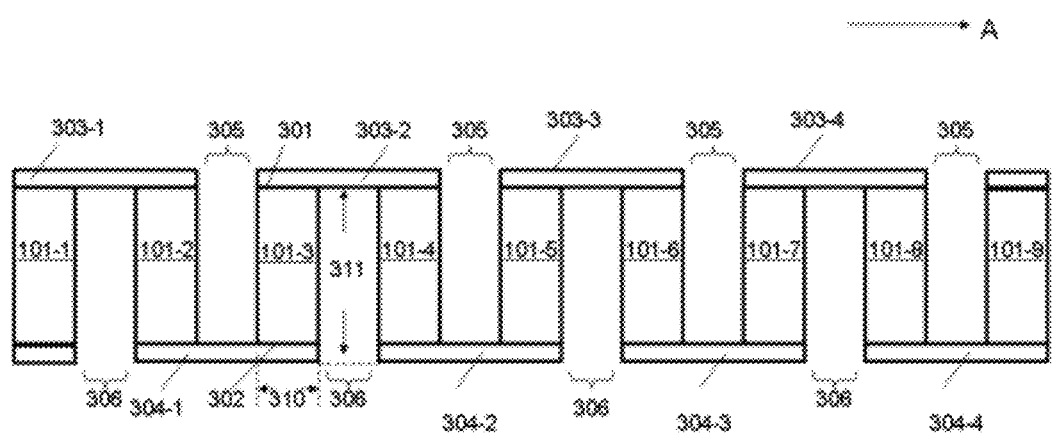
FIG. 1 is a schematic view of a strip plate structure according to an embodiment of the present invention.

Embodiments of the present invention are described in detail in the following text and are illustrated in the drawings, wherein like reference numerals used throughout the description represent like components or components having like functions. The embodiments described in conjunction with the drawings below are merely illustrative and used to only explain the present invention, which cannot be construed as limiting the present invention. The disclosure of the following text provides various embodiments or examples for realizing different structures of the present invention. In order to simplify the disclosure of the present invention, component parts and configurations of specific examples are described in the following text. Of course, they are only examples and are not directed to limit the present invention. Furthermore, reference numerals and/or letters may be repeated in different examples of the present invention. Such repetition is for the purposes of simplification and clearness, and does not denote the relationship between respective embodiments and/or arrangements being discussed. Furthermore, the present invention provides various examples for specific processes and materials. However, it is obvious for a person of ordinary skill in the art that other process and/or materials may alternatively be utilized. Furthermore, the structure in which a first object is "on" a second object described in the following text may include embodiments in which the first and second objects are in direct contact with each other, and it may also include the embodiments in which another object is between the first and second objects such that the first and second objects may not be in direct contact with each other.

The present invention mainly lies in improving the utilization rate of substrates, such as semiconductor substrates, and increasing the surface area thereof that can be processed by forming a strip plate structure having a cross-sectional profile similar to battlements such as those seen on the Great Wall of China.

FIG. 1 shows a schematic view of the strip plate structure of an embodiment of the present invention, wherein said strip plate structure is obtained by processing a substrate with microfabrication methods. The substrate may be a semiconductor substrate with a thickness of approximately 0.2-2 mm, for example. The strip plate structure may comprise a strip plate array that includes a plurality of strip plates 101-1, 101-2, . . . , and 101-9 arranged in a predetermined direction. It should be noted that the figure merely shows an example and the number of said strip plates may be arbitrarily configured, and preferably, to be at least two. The predetermined direction is indicated by an arrow A in FIG. 1, and in this particular example the said plurality of strip plates are substantially aligned in the direction of A. As shown, each of said strip plates has a first surface 301 (on the top side of the strip structure) and a second surface 302 opposite to the first surface (i.e., on the bottom side of the strip structure). Said strip plate structure further comprises a plurality of strip sheets 303-1 . . . 303-4 and 304-1 . . . 304-4. Again, the figure merely shows an example, and the number of the strip sheets may be configured, and preferably, to be at least one. Said plurality of strip sheets are respectively provided to abut either the first surfaces 301 or the second surfaces 302 of adjacent strip plates. That is, for each of the strip plates spaced apart in the direction of A (except for the first strip plate and the last strip plate in the array), its second surface 302 shares a strip sheet with the second surface 302 of a neighboring strip plate on one side to form a first trench 305; and the first surface 301 of said each strip plate shares another strip sheet with the first surface 301 of another neighboring strip plate on the other side to form a second trench 306; and the opening direction of said first trench 305 and that of the second trench 306 are substantially opposite to each other, such that said strip plate structure has a cross-sectional profile of a Great Wall (battlements) shape.

Specifically, for instance, for each of the spaced strip plates, such as each of 101-1, 101-3, 101-5 . . . , and in particular, for the strip plate 101-3, the second surface 302 of said strip plate 101-3 shares a strip sheet 304-1 with a second surface 302 of a neighboring strip plate 101-2 on one side thereof to form a first trench 305, and the first surface 301 of said strip plate 101-3 shares another strip sheet 303-2 with a first surface 301 of another neighboring strip plate 101-4 on the other side thereof to form a second trench 306, and the opening direction of the first trench 305 and that of the second trench 306 are substantially opposite to each other.

Said strip plates may include or be made from semiconductor materials, such as silicon, germanium and a compound semiconductor, or combinations thereof, and it may also include an N-type doping configuration or a P-type doping configuration, all of which may be configured according to the requirements for the strip plate structure in practical applications, and thus the present invention will not make any limitation.

Specifically, said strip plate array may be formed by a material which is the same as or different from the material of said plurality of strip sheets. Said strip sheets may also be semiconductor materials, or they may be insulation materials, metals, or a combination of the aforesaid materials. Furthermore, said strip sheet may include one or more layers. The materials for each layer may be configured according to needs, for instance, said layers may have an insulating layer(s) for etch stop, and/or a conductive layer for conduction, etc. All of the above may be configured according to the requirements for the strip plate structure in practical application, and thus the present invention will not make any limitation. Furthermore, optionally, the outer surfaces of said strip sheet are defined as (or align with) the two surfaces of said substrate.

Specifically, said strip plate structure further has an interface layer (not shown in the figures) formed at least on the sidewalls of said first trench 305. Specifically, said strip plate structure may further include another interface layer (not shown in the figures) formed at least on the sidewalls of said second trench 306. Said interface layers may be formed by various methods, such as dopant ion diffusion, semiconductor thin film deposition and post-deposition diffusion annealing, which may be selected depending on needs. Said interface layer is formed at least on the sidewalls of the first trench, and in some embodiments, said interface layer may be formed on the entire inner surface of the first trench.

When said substrate is formed of crystalline materials, such as crystalline Si, crystalline Ge, crystalline SiGe or a combination thereof, wet etching may be adopted to form said first trench and said second trench, and under the circumstance that the crystal orientation of said first surface and said second surface is $\{110\}$ or $\{112\}$, the crystal orientation of the strip plate surface corresponding to said first trench and said second trench is $\{111\}$. Specifically, when said plurality of first trenches 305 and said plurality of second trenches 306 are substantially parallel with each other, said strip plate array may comprise a plurality of substantially parallel strip plates. Specifically, said strip plates and the strip sheets abutting thereon are substantially perpendicular to each other, i.e. said first trench and said second trench may be substantially rectangular in shape.

Hence, a strip plate structure having a Great Wall shape is formed. Said strip plate structure makes effective use of the thickness of the substrate, specifically, when the depth 311 of at least one of said first trench 305 and said second trench 306 is greater than twice of the width 310 of the strip plates (the distance between the surfaces corresponding to the sidewalls of the two neighboring trenches that share the same strip plate), more surface area that can be processed of the substrate can be obtained and the utilization rate of the surface area of the substrate can be increased on the premise that the dimensions of the substrate are not increased. Furthermore, when the thickness of said strip sheet is small enough, for instance, when the thickness of said strip sheet is smaller than ⅓ of the width of said strip plate, said strip plate structure can be easily stretched using a proper process so as to facilitate subsequent processes. Furthermore, since said strip plate structure has a Great Wall shape, different material deposition and processing can be easily performed on the two sides of the strip plate structure, respectively, in subsequent processes using the two sets of trenches having opposite opening directions so that the manufacturing process is simplified and the cost is reduced.

A novel strip plate structure according to an embodiment of the present invention has been described with reference to FIG. 1 in the above, and said strip plate structure may be used in various fields, such as the manufacturing of semiconductor devices and the manufacturing of thin-film solar cells. It should be noted that those skilled in the art are able to select various manufacturing processes, based on the aforesaid strip plate structure, for different types of product lines and different process flows, but the strip plate structures formed in such processes should be within the spirit and scope of the present invention as long as they have substantially the same structure as the strip plate structure of the present invention and can achieve substantially the same effect. In order to better understand the present invention, exemplary methods and processes for forming the aforesaid strip plate structure of the present invention will be described in detail in the following, and it should be noted that the following exemplary steps are merely illustrative and are not intended to limit the present invention, and those skilled in the art may realize them through alternative processes. The following embodiments are the preferred embodiments of the present invention, which can effectively reduce production cost.

Figure 2:
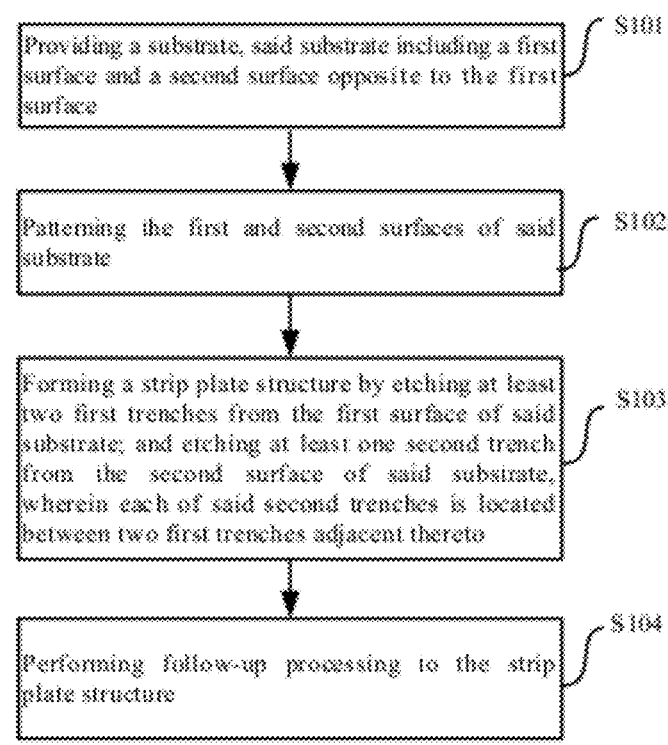
FIG. 2 is a flowchart illustrating a method of forming a strip plate structure according to an embodiment of the present invention.
Figure 3:
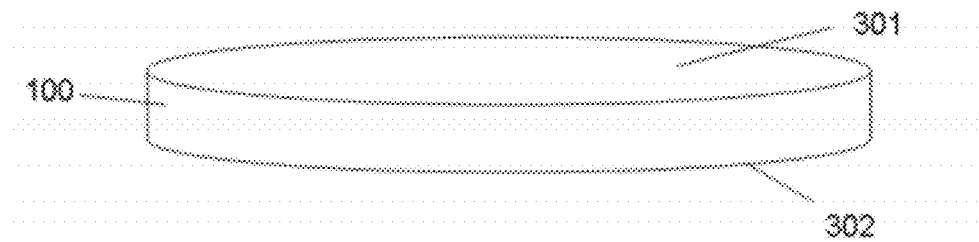
FIGS. 3-12 are schematic diagrams illustrating various stages of a method of manufacturing a strip plate structure according to the present invention.
Figure 4:
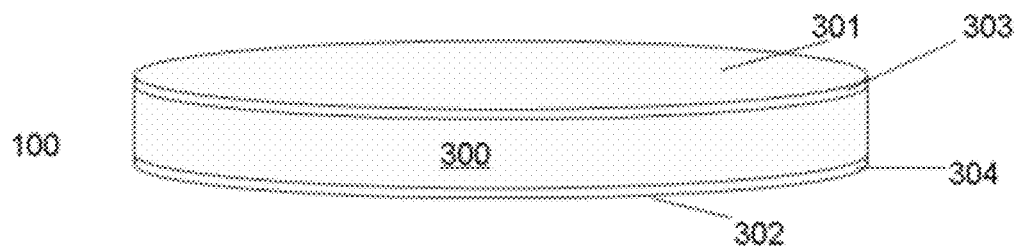

FIG. 2 shows a flowchart illustrating a method of forming a strip plate structure according to an embodiment of the present invention, which comprises the following steps:

Step S101, as show in FIG. 3, in which a substrate 100 is provided. In an embodiment of the present invention, said substrate 100 is a semiconductor substrate, such as silicon, germanium, a compound semiconductor or a combination thereof. It may be monocrystalline Si, monocrystalline Ge, monocrystalline SiGe, polycrystalline Si, polycrystalline Ge, polycrystalline SiGe or a combination thereof. In other embodiments, said semiconductor substrate may be formed by various methods, such as deposition, epitaxial growth, etc. and said substrate may include an N-type doping configuration or a P-type doping configuration. The thickness of said semiconductor substrate may be 0.2-2 mm, for example, and of course in present invention it is not limited to that range. Said substrate has a first surface 301 and a second surface 302, and said first surface 301 and said second surface 302 are opposite to each other. Specifically, said substrate may have one or more layers, for instance, said substrate may have a semiconductor layer 300 and material layers 303 and 304 formed on and beneath said semiconductor layer, as shown in FIG. 4. Each of said material layers 303 and 304 may also include one or more layers, and the materials for each layer may be configured according to needs, for instance, they may have an insulating layer(s) for etch stop, a conductive layer(s) for conduction, etc. Each of said material layers 303 and 304 may be formed of materials which are the same as or different from that of said semiconductor layer, including but not limited to insulating materials, metals, semiconductor materials or a combination thereof. All of the above may be configured according to specific needs in practical applications, and thus no limitation is made in the present invention.

Figure 5:
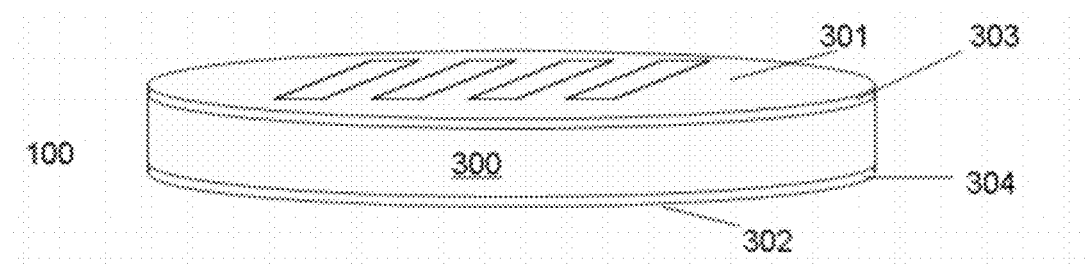
Figure 6:
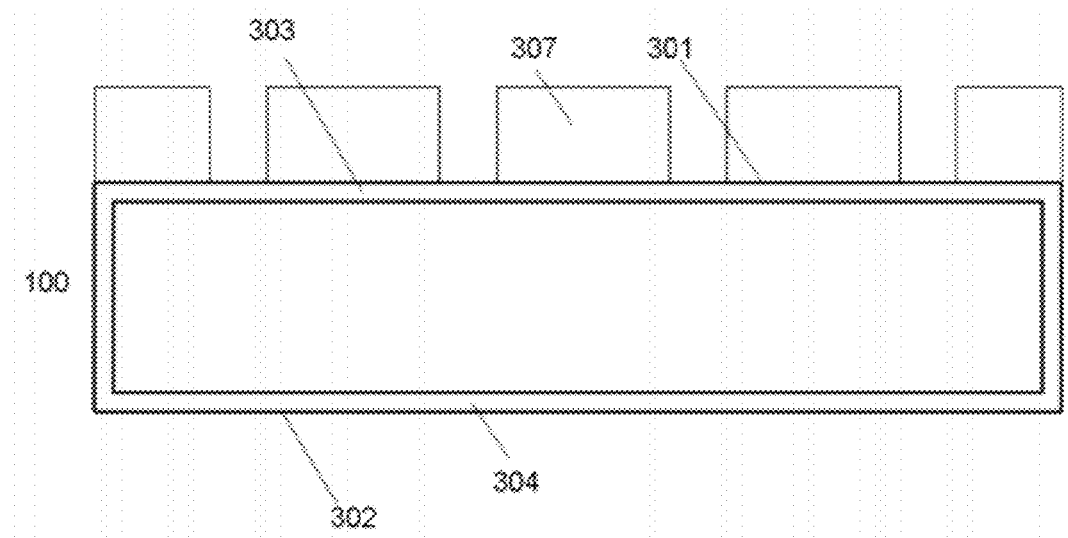
Figure 7:
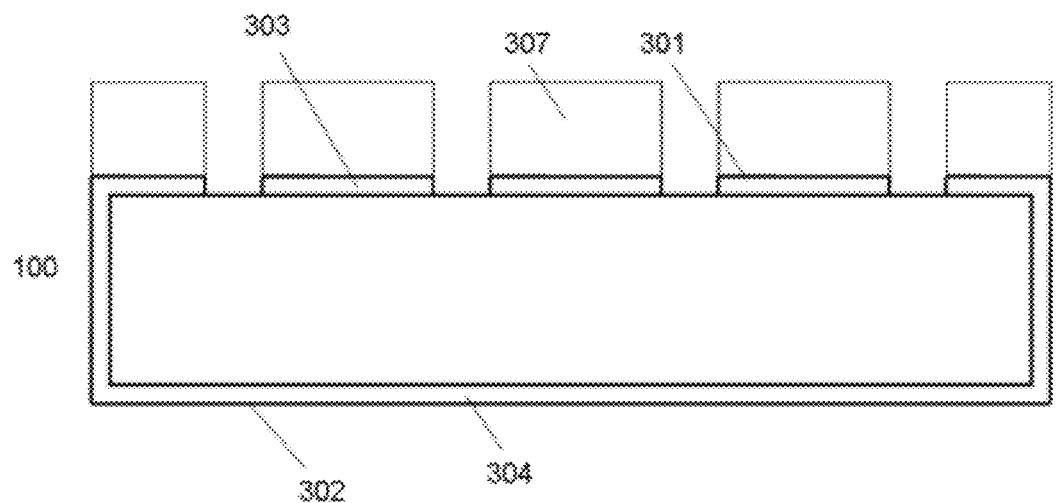
Figure 8:
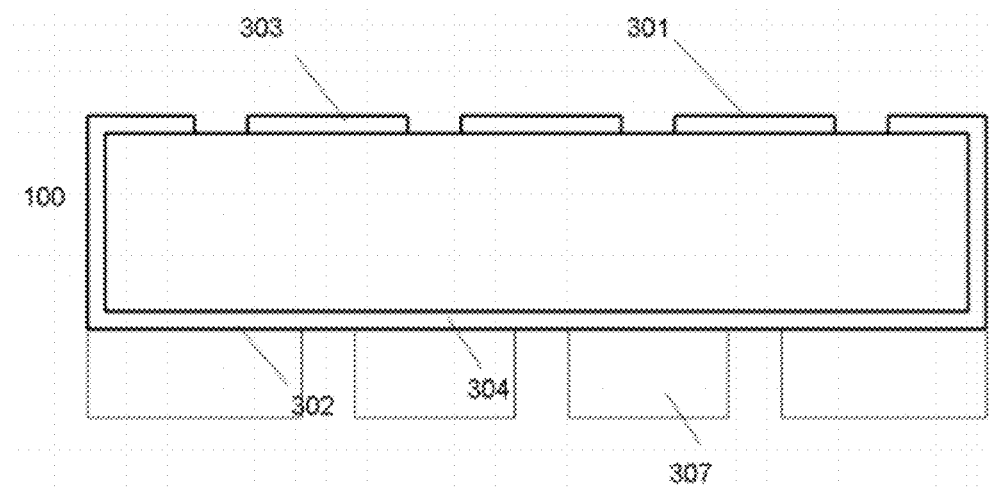
Figure 9:
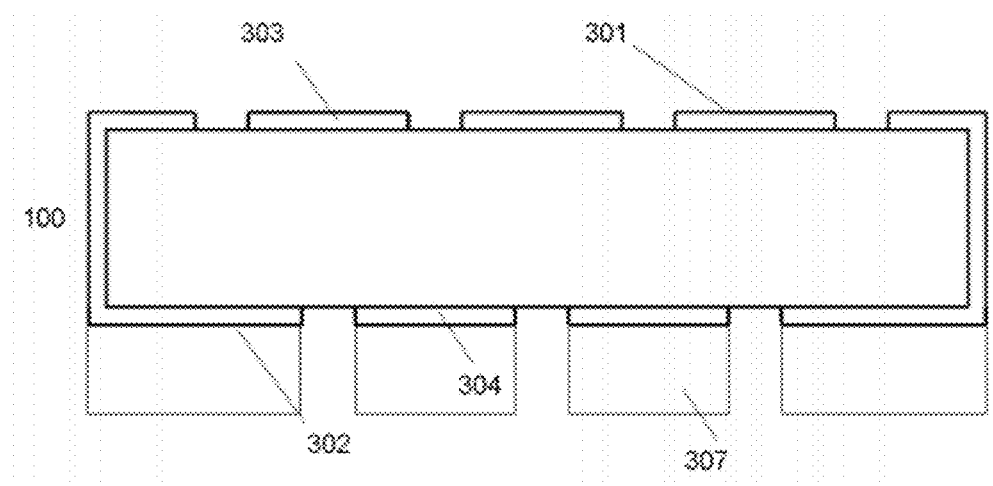
Figure 10:
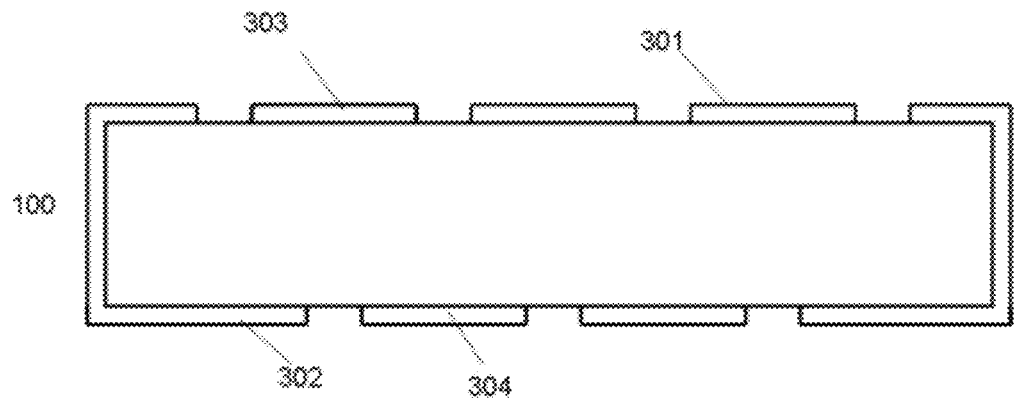

Step S102, as shown in FIGS. 5-10, in which the first surface 301 and the second surface 302 of said substrate 100 are patterned, as shown in FIG. 5. Taking the structure of the substrate shown in FIG. 4 as an example, said substrate 100 may be patterned by the following method: forming a patterned photoresist layer 307 having openings with predetermined spacing on the first surface 301 of said substrate 100, as shown in FIG. 6; etching said substrate 100 to remove the material layer 303 through the openings on said first surface 301, as shown in FIG. 7; removing said photoresist layer 307; forming a patterned photoresist layer 307 with predetermined spacing on said second surface 302, as shown in FIG. 8; etching said substrate 100 to remove the material layer 304 through openings on said second surface 302, as shown in FIG. 9; and removing said photoresist layer 307, as shown in FIG. 10. Of course, the aforesaid patterning steps are only illustrative, and those skilled in the art may obtain said patterned substrate in the present embodiment by various methods known in the art, all of which may be applied to the present embodiment without departing from the spirit and scope of the present invention.

Figure 11:
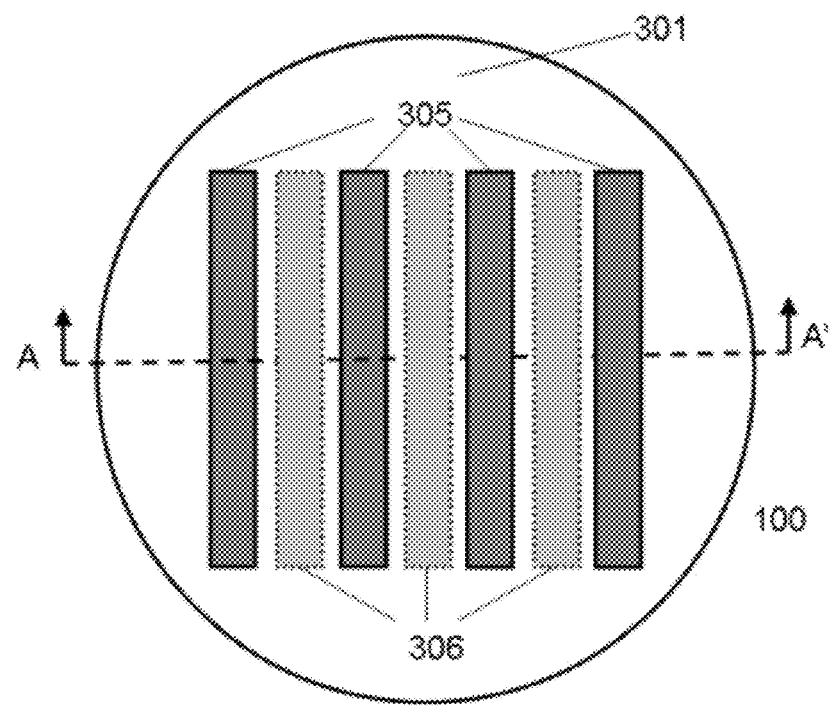

Step S103, as shown in FIG. 11, in which at least two first trenches 305 are etched from the first surface 301 of said substrate 100; and at least one second trench 306 is etched from the second surface 302 of said substrate 100. Optionally, all or part of said semiconductor layer 300 may be etched, for instance, the first surface 301 of said substrate may be etched, and the etching stops at the material layer 304 on said second surface 302, and the second surface 302 of said substrate may be etched, and the etching stops at the material layer 303 on said first surface 301. Alternatively, only part of the semiconductor layer may be etched, i.e. the bottom portions of the first and second trenches do not expose said material layers 304 and 303. When said substrate has only one layer, only part of the substrate can be etched. In FIG. 11, dark-colored areas defined by solid lines represent the first trenches 305 formed on said first surface 301, the light-colored areas defined by dashed lines represent the second trenches 306 formed on said second surface 302. Said first and second trenches may have same or different spacing. Specifically, said substrate may be patterned such that said first and second trenches are substantially parallel to each other, all of which may be configured according to design requirements. Hence, each of said second trenches 306 is located between two neighboring ones of said first trenches 305 such that said substrate is divided into at least two strip plates and at least one strip sheet. Said strip plates are defined by the sidewalls of the first trenches 305 and the second trenches 306, and said strip sheets connect two neighboring ones of said strip plates. A strip plate structure, as shown in FIG. 1, having a Great Wall shape is obtained. FIG. 1 shows a cross-sectional view of the substrate shown in FIG. 11 along AA' direction. Preferably, the depth 311 of one of said first trench 305 and second trench 306 is greater than twice of the width 310 (the distance between the surfaces corresponding to the sidewalls of the two neighboring trenches which belong to one same strip plate) of the strip plates.

According to the properties of the material of said substrate, those skilled in the art may select proper etching methods to form said first trenches 305 and said second trenches 306 without departing from the spirit and scope of the present invention. For instance, anisotropic etching may be adopted, such as reactive-ion etching (RIE), dry etching or a combination thereof, to form said first trenches 305 and said second trenches 306. Specifically, when said substrate has monocrystalline material, such as monocrystalline Si, monocrystalline Ge, monocrystalline SiGe or a combination thereof, wet etching such as potassium hydroxide (KOH), tetramethylammonium hydroxide (TMAH) or ethylenediamine-pyrocatechol (EDP), may be adopted, and under the circumstance that the crystal orientation of said first surface and said second surface is {110} or {112}, the crystal orientation of the surfaces corresponding to the sidewalls of the first and second trenches so formed will be {111}.

Specifically, when said plurality of first trenches 305 and said plurality of second trenches 306 are substantially parallel with each other, said strip plate array may comprise a plurality of substantially parallel strip plates. Specifically, said strip plates and the strip sheets abutting thereon are substantially perpendicular to each other, i.e. said first trench and said second trench may be substantially rectangular in shape.

Then, in step S104, subsequent processing may be performed to the so formed strip plate structure. Specifically, an interface layer (not shown in the figures) may be formed at least on the sidewalls of said first trench 305 after the strip plate structure shown in FIG. 1 is formed. Specifically, another interface layer (not shown in the figures) may be formed at least on the sidewalls of said second trench 306 after the strip plate structure shown in FIG. 1 is formed. Said interface layers may be formed by various methods, such as dopant ion diffusion, semiconductor thin film deposition and post-deposition diffusion annealing, which may be selected depending on needs. Said interface layer is formed at least on the sidewalls of the first trench, and in some embodiments, said interface layer may also be formed on the whole inner surface of the first trench.

Figure 12:
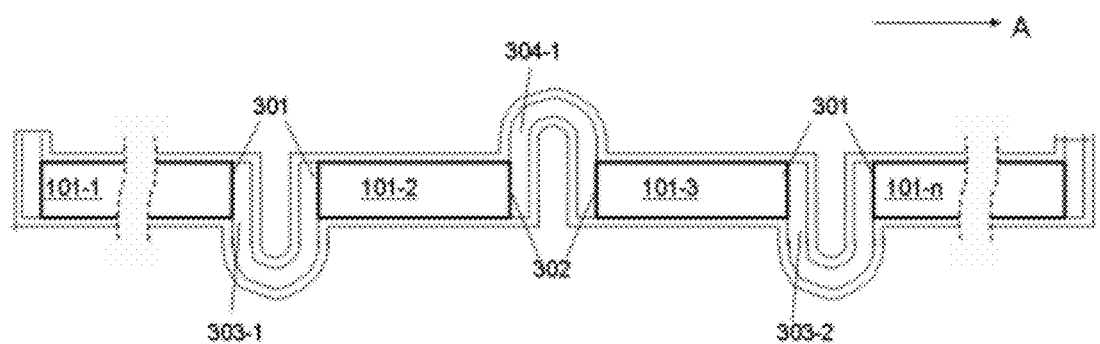

In addition, in step S104, subsequent processing may be performed to the strip plate structure by the following method: for instance, when the thickness of said strip sheets is thin enough, e.g. smaller than ⅓ of the width of said strip plates, said strip plate structure can be easily stretched through a proper process, e.g. stretching said strip plate structure along the predetermined direction A as shown in FIG. 1 such that each strip sheet between neighboring strip plates bends and the bending curvature of its neighboring strip sheets is opposite thereto such that said strip plate array substantially forms a plane and further forms a new strip plate structure, as shown in FIG. 12.

In said new strip plate structure, said strip plate array comprises a plurality of strip plates arranged in the predetermined direction, such as 101-1 . . . 101-n, and each strip plate has a first surface 301 and a second surface 302 opposite to the first surface, as for each of said strip plates spaced apart, the first surface 301 thereof is opposite to a first surface 301 of a neighboring strip plate on one side thereof, and the second surface 302 thereof is opposite to a second surface 302 of another neighboring strip plate on the other side thereof, said strip plate structure further comprises at least one bendable strip sheet, such as 303-1, 303-2, 304-1 . . . . Said bendable strip sheets are formed on the two opposite surfaces of neighboring strip plates and are bendably connected to said neighboring strip plates. Preferably, said plurality of strip plates have at least three strip plates, and said bendable strip sheets have at least two strip sheets, wherein the bending curvatures of the neighboring bendable strip sheets are opposite to each other. Specifically, said strip plate array is arranged in a plane perpendicular to said first surface.

The strip plate structure having a Great Wall shape is formed above according to the method of the present invention. Said strip plate structure makes effective use of the thickness of the substrate. Specifically, when the depth 311 of at least one of said first trench 305 and said second trench 306 is greater than twice of the width 310 of the strip plates (the distance between the surfaces corresponding to the sidewalls of the two neighboring trenches that belong to the same strip plate), more surface area that can be processed of the substrate can be obtained and the utilization rate of the surface area of the substrate can be increased on the premise that the dimensions of the whole substrate are not increased.

Furthermore, since said strip plate structure has a Great Wall shape, different material deposition and processing can be easily performed on the two sides of the strip plate structure, respectively, in the subsequent processes using the two sets of trenches having opposite opening directions such that the throughput is increased and the cost is reduced. Meanwhile, said strip sheets may be bended when said strip plate structure is stretched such that the strip plate array is reshaped substantially into a plane, which facilitates subsequent treatments and processing. Although the embodiments of the examples and the advantages thereof have been described in detail, it is understood that any variation, amendment, replacement and modification may be made to said embodiments without departing from the spirit and the scope of the present invention defined by the appended claims. As for other examples, those of ordinary skill in the art can easily understand that the order of the processing steps may be varied within the spirit and scope of the present invention.

Furthermore, the application scope of the present invention is not intended to be limited to the processes, mechanisms, manufacturing, composition of the substances, means, methods and steps of the specific embodiments described in the description. Those of ordinary skill in the art can easily see from the contents disclosed in the present invention that the processes, mechanisms, manufacturing, composition of the substances, means, methods or steps existing or yet to be developed can be applied according to the present invention where the application of them have substantially the same function as the corresponding embodiments describe in the present invention or substantially the same effect can be achieved. Therefore, it is intended that the claims appended here below will include said processes, mechanisms, manufacturing, composition of the substances, means, methods or steps within the spirit and scope thereof.

What is claimed is:

1. A strip plate structure formed from a substrate, comprising:
   a strip plate array, comprising a plurality of strip plates with spacing, each of said strip plates including a first surface facing one direction of the strip plate structure and a second surface facing a substantially opposite direction of the strip plate structure; and
   a plurality of strip sheets, each strip sheet alternately abutting either the first surfaces or the second surfaces of two adjacent strip plates,
   wherein the second surface of a first strip plate shares a first strip sheet with the second surface of a neighboring second strip plate on one side of said first strip plate to form a first trench, and the first surface of said first strip plate shares a second strip sheet with the first surface of a neighboring third strip plate on the other side of said first strip plate to form a second trench, and the openings of said first trench and said second trench face opposite sides of the strip plate structure.

2. The strip plate structure according to claim 1, wherein said strip plate array is formed of a first material which is different from a material of said plurality of strip sheets.

3. The strip plate structure according to claim 2, wherein said strip plates comprise one or more semiconductor materials.

4. The strip plate structure according to claim 3, wherein said strip plates comprise one or more materials selected from a group consisting of monocrystalline Si, monocrystalline Ge, and monocrystalline SiGe.

5. The strip plate structure according to claim 4, wherein the crystal orientation of the surfaces of the strip plates that make up the sidewalls of said first and second trenches is {111}.

6. The strip plate structure according to claim 1, further comprising at least one interface layer formed on sidewalls of said first trench, and another interface layer on the sidewalls of said second trench.

7. The strip plate structure according to claim 1, wherein said plurality of strip plates are substantially parallel with one another.

8. The strip plate structure according to claim 1, wherein said strip plates and the strip sheets abutting thereon are substantially perpendicular to each other.

9. A method of manufacturing a strip plate structure for semiconductor devices, comprising:
providing a substrate, said substrate having a first surface facing a first direction of said substrate and a second surface facing a second direction substantially opposite to the first direction of said substrate;
forming at least two first trenches through the first surface of said substrate; and
forming at least one second trench through the second surface of said substrate,
wherein each of said at least one second trench is located between two adjacent first trenches such that sidewalls of these neighboring trenches form at least two strip plates and at least one strip sheet, said strip plates are defined by the sidewalls of neighboring ones of said first trenches and said second trench, and said strip sheet alternately abuts two neighboring strip plates.

10. The method according to claim 9, wherein said substrate comprises one or more semiconductor materials.

11. The method according to claim 9, wherein said substrate comprises a semiconductor layer, a first material layer formed on the first surface of said substrate, and a second material layer formed on the second surface of said substrate, wherein each of said first and second material layers comprises one or more materials selected from a group consisting of insulation materials, metals, and semiconductor materials.

12. The method according to claim 11, wherein said steps of forming said at least two first trenches and forming said at least one second trench comprise:
etching said at least two first trenches through the first surface of said substrate, and stopping at the second material layer on said second surface; and
etching at least one second trench through the second surface of said substrate, and stopping at the first material layer on said first surface.

13. The method according to claim 11, further comprising patterning said substrate by:
forming a first photoresist layer to define a first plurality of openings on the first material layer on said first surface;
etching said substrate to remove the first material layer at the first plurality of openings of said first surface;
removing said first photoresist layer;
forming a second photoresist layer with a second plurality of openings on the second material layer on said second surface;
etching said substrate to remove the second material layer at the second plurality of openings of said second surface; and
removing said second photoresist layer.

14. The method according to claim 9, further comprising a step of forming an interface layer at least on the sidewalls of said at least two first trenches or said at least one second trench.

15. The method according to claim 9, wherein said substrate comprises one or more materials selected from a group consisting of monocrystalline Si, monocrystalline Ge, and monocrystalline SiGe.

16. The method according to claim 15, wherein the crystal orientation of sidewall surfaces of said first and second trenches is {111}.

17. The method according to claim 9, wherein said strip plates are substantially parallel with each other or said strip plates are substantially perpendicular to the strip sheet abutting on said strip plates.

18. The method according to claim 9, wherein a depth of at least one of said first and second trenches is greater than twice the width of said strip plates, wherein the width of each said strip plate is the distance between its surfaces that make up the sidewalls of two neighboring trenches.

19. The method according to claim 9, further comprising stretching said strip plate structure along the direction in which the strip plates are arranged such that the strip sheet between neighboring strip plates bend and the first surface of each of said strip plates is substantially opposite to the first surface of a neighboring strip plate on one side thereof, and the second surface thereof is substantially opposite to the second surface of another neighboring strip plate on another side thereof.

20. A strip plate structure formed from a substrate, comprising:
a strip plate array, comprising a plurality of strip plates arranged in a predetermined direction with spacing, each of said plurality of strip plates including a first surface and a second surface substantially opposite to the first surface, wherein the first surface of each of the strip plates is opposite to the first surface of a neighboring strip plate on one side thereof, and the second surface of each strip plate is substantially opposite to the second surface of a neighboring strip plate on the other side thereof; and
at least one bendable strip sheet, bendably connecting the two opposite surfaces of neighboring strip plates.

21. The strip plate structure according to claim 20, wherein said bendable strip sheets comprises at least two strip sheets, wherein the bending directions of the neighboring bendable strip sheets are substantially opposite to each other.

22. The strip plate structure according to claim 20, wherein at least two of said strip plates in said strip plate array are arranged in a plane perpendicular to said first surface.

23. The strip plate structure according to claim 20, wherein said strip plate array is formed of a material which is the same as or different from the material of said plurality of strip sheets.

24. The strip plate structure according to claim 23, wherein said strip plates comprise one or more semiconductor materials.

25. The strip plate structure according to claim 24, wherein said strip sheet comprises one or more insulation materials.

26. The strip plate structure according to claim 24, wherein said strip plate comprises one or more materials selected from a group consisting of: monocrystalline Si, monocrystalline Ge, and monocrystalline SiGe.

27. The strip plate structure according to claim 26, wherein the crystal orientation of the plane on which said strip plate array is located is {111}.

28. The strip plate structure according to claim 1, wherein each strip sheet and the two adjacent strip plates it abuts on form a trench, and the openings of two neighboring trenches face substantially opposite directions of the strip structure.

29. The strip plate structure according to claim 1, wherein said strip sheets comprise one or more insulation materials.

30. A strip plate structure manufactured according to the method of claim 9.

31. The strip plate structure according to claim 28, wherein a depth of at least one of said trenches is greater than twice the width of said strip plates, wherein the width of each said strip plate is the distance between its surfaces that make up the sidewalls of two neighboring trenches.

* * * * *